(12) United States Patent
Germagian

(10) Patent No.: US 11,895,801 B1
(45) Date of Patent: Feb. 6, 2024

(54) RACK POWER DISTRIBUTION UNIT METHOD AND SYSTEM FOR CONSTRUCTION ALLOWING GREATER UNIT PERMUTATIONS AND OPTIMIZED MANUFACTURING EFFICIENCY

(71) Applicant: Mark Germagian, Harvard, MA (US)

(72) Inventor: Mark Germagian, Harvard, MA (US)

(73) Assignee: Gateview Technologies, Inc., Harvard, MA (US)

( * ) Notice: Subject to any disclaimer, the term of this patent is extended or adjusted under 35 U.S.C. 154(b) by 79 days.

(21) Appl. No.: 16/898,432

(22) Filed: Jun. 10, 2020

(51) Int. Cl.
| | |
|---|---|
| *H05K 7/14* | (2006.01) |
| *H01R 25/00* | (2006.01) |
| *H01R 25/16* | (2006.01) |
| *H01R 13/518* | (2006.01) |
| *H01R 13/70* | (2006.01) |
| *H01R 12/53* | (2011.01) |
| *H01R 12/51* | (2011.01) |

(52) U.S. Cl.
CPC ......... *H05K 7/1492* (2013.01); *H01R 13/518* (2013.01); *H01R 13/70* (2013.01); *H01R 25/006* (2013.01); *H01R 25/162* (2013.01); *H01R 12/51* (2013.01); *H01R 12/53* (2013.01)

(58) Field of Classification Search
CPC ...... H01R 12/53; H01R 12/51; H01R 25/162; H01R 25/006; H01R 13/70; H01R 13/518; H05K 7/1492
See application file for complete search history.

(56) References Cited

U.S. PATENT DOCUMENTS

| | | | |
|---|---|---|---|
| 6,250,956 B1 * | 6/2001 | Pulizzi | H02B 1/044 |
| | | | 439/535 |
| 8,033,867 B1 * | 10/2011 | Kessler | H01R 27/00 |
| | | | 439/652 |
| 8,882,536 B2 * | 11/2014 | Utz | H05K 7/1492 |
| | | | 439/535 |
| 10,025,337 B2 | 7/2018 | Hancock et al. | |
| 2012/0034801 A1 * | 2/2012 | Hsu | H01R 13/518 |
| | | | 439/345 |

\* cited by examiner

*Primary Examiner* — Briggitte R. Hammond
(74) *Attorney, Agent, or Firm* — Olive Law Group, PLLC

(57) ABSTRACT

The present disclosure provides a method of standardizing the construction of a power distribution device that includes power conveying wires, a plurality of receptacles, a power conveying flexible bus assembly, a plurality of power connection boards, a plurality of circuit breakers, a standardized receptacle module carrier, and a customized cover. The standardized receptacles and the receptacle printed circuit boards are configured into modules arranged and aligned about the standardized receptacle module carrier. The standardized receptacle module carrier is attached to the standardized common chassis. A customized cover is attached to the standardized common chassis.

26 Claims, 19 Drawing Sheets

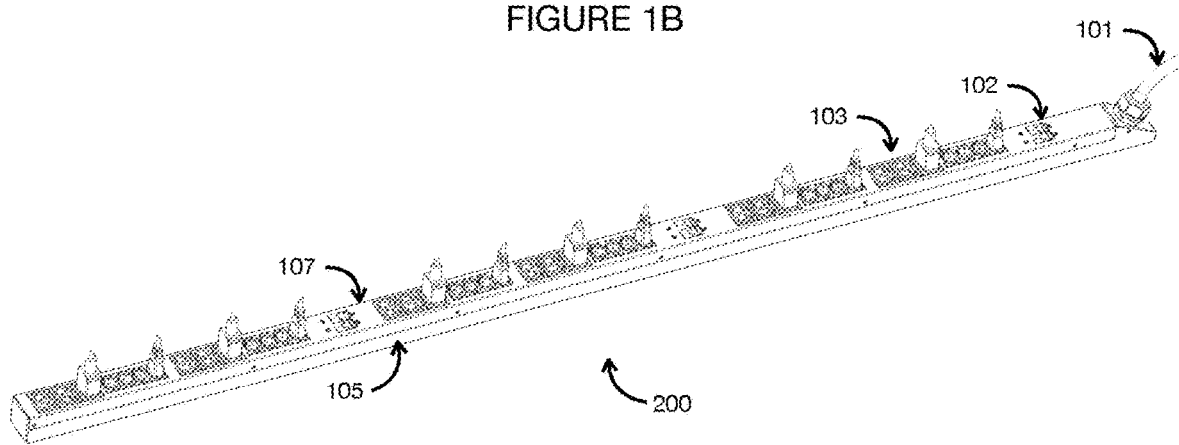

FIGURE 3A1 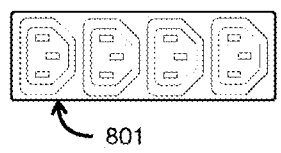 801
FIGURE 3A2 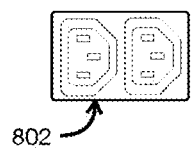 802
FIGURE 3A3 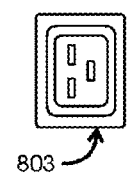 803
800

FIGURE 3B1
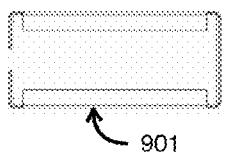
901
FIGURE 3B2
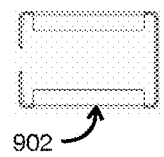
902
FIGURE 3B3
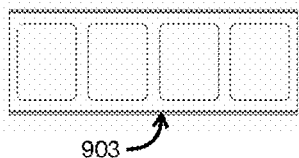
903
FIGURE 3B4
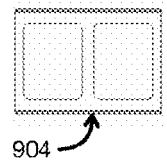
904
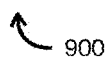
900

FIGURE 3C1    FIGURE 3C2    FIGURE 3C3    FIGURE 3C4
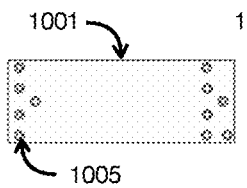 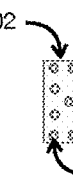 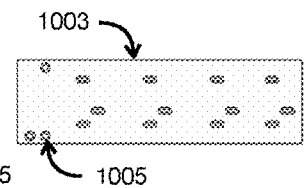 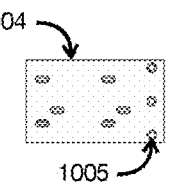
1001 — 1002 — 1003 — 1004 —
1005   1005   1005   1005
1000

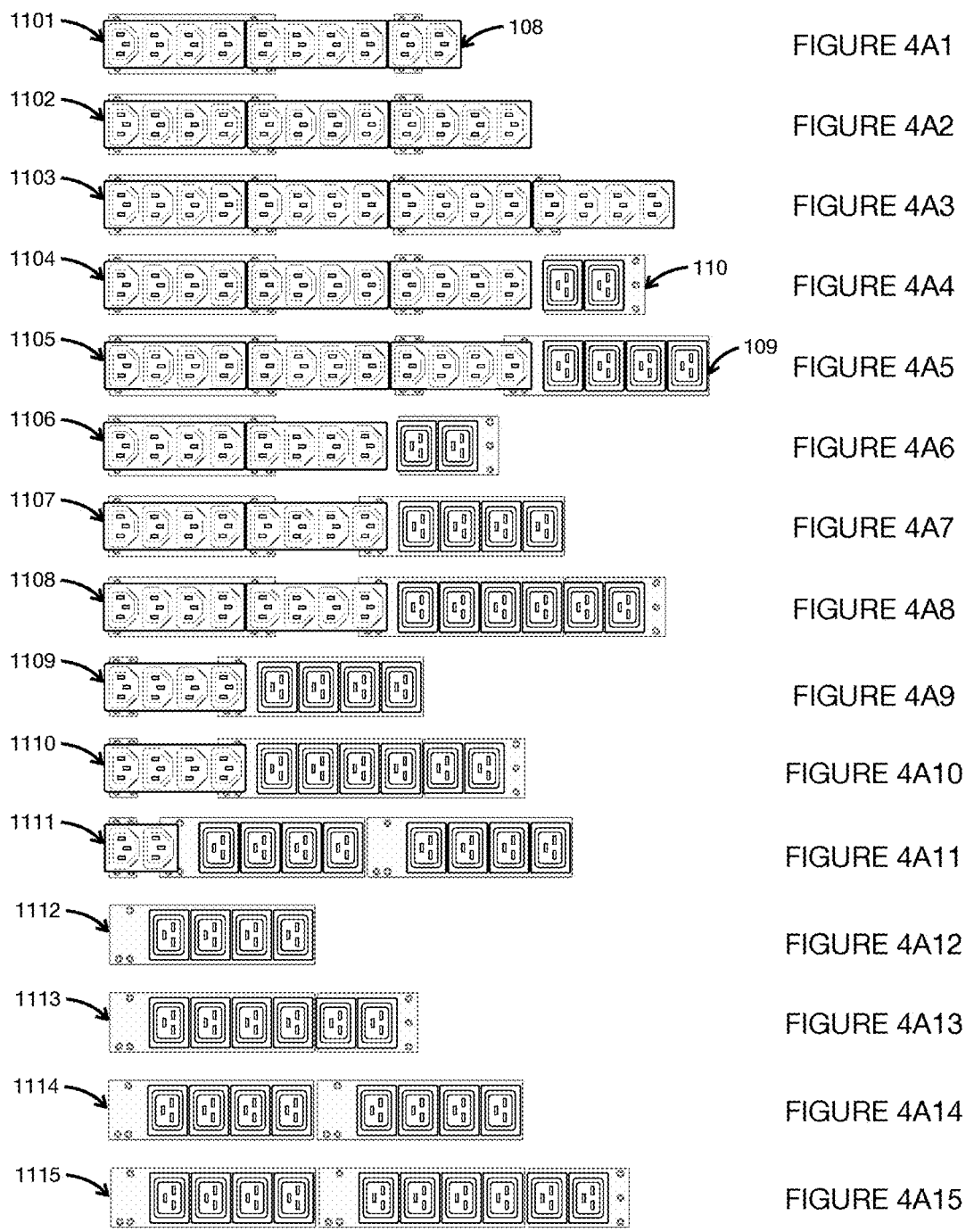

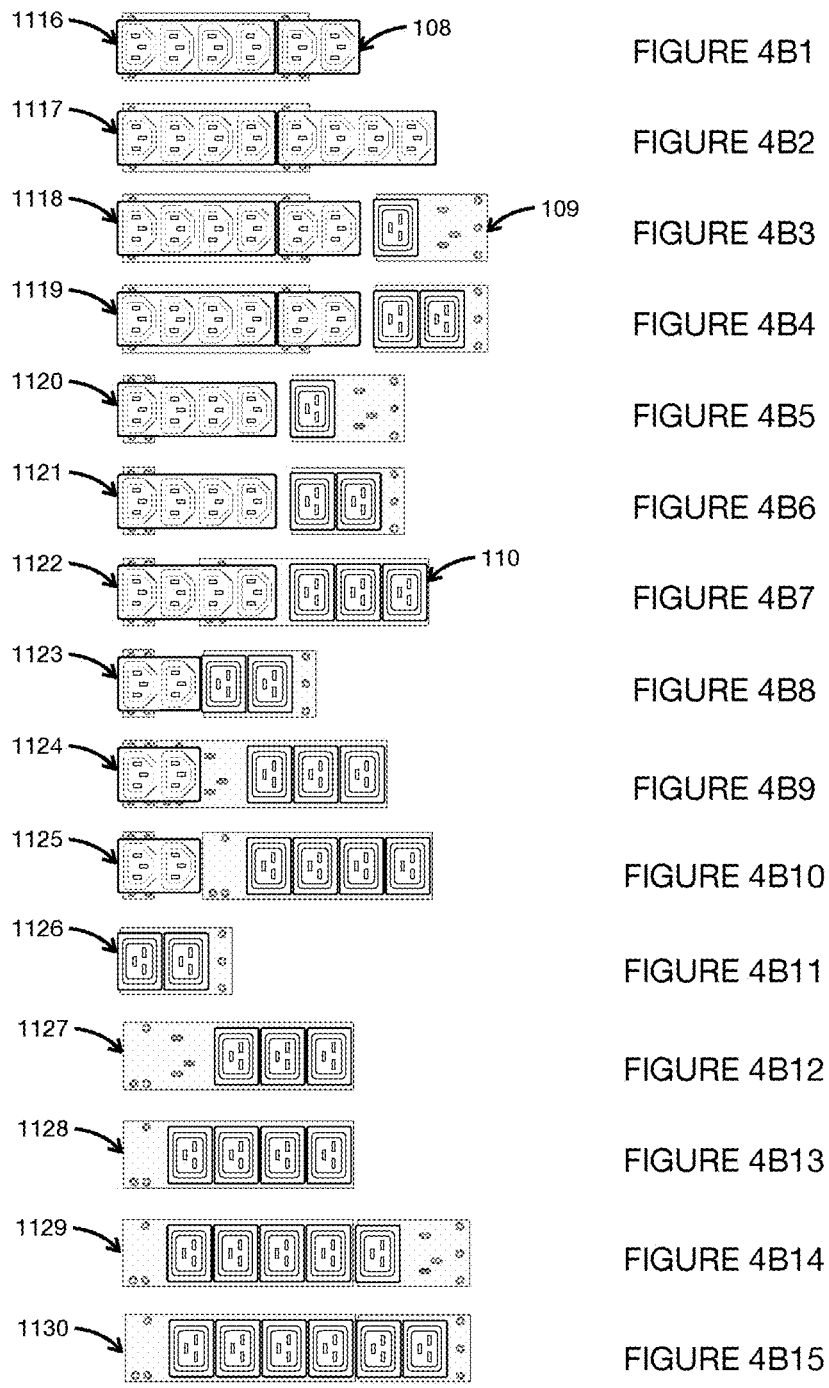

FIGURE 5A1
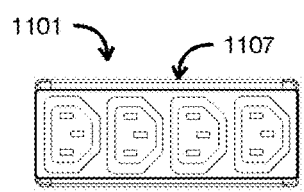
1101, 1107
FIGURE 5A2
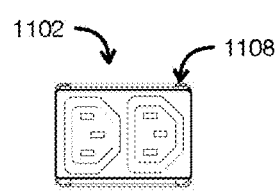
1102, 1108
FIGURE 5A3
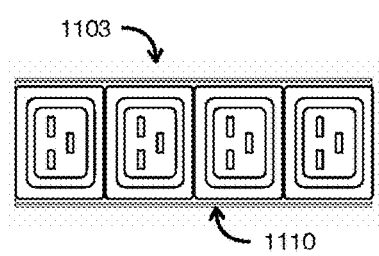
1103, 1110
FIGURE 5A4
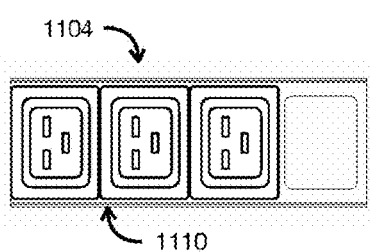
1104, 1110
FIGURE 5A5
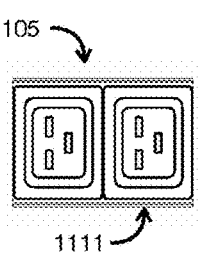
1105, 1111
FIGURE 5A6
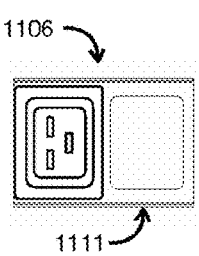
1106, 1111
1100

FIGURE 5B1   FIGURE 5B2   FIGURE 5B3   FIGURE 5B4
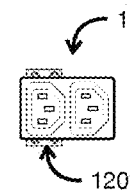 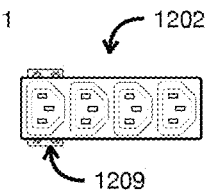 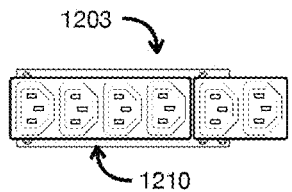 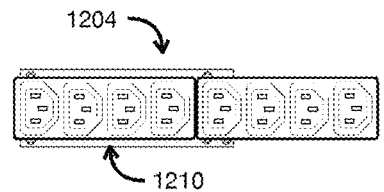
FIGURE 5B5   FIGURE 5B6   FIGURE 5B7   FIGURE 5B8
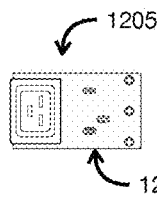 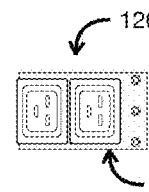 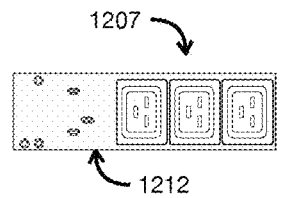 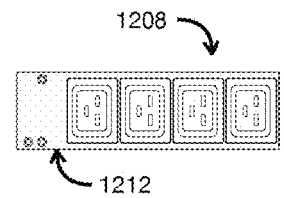
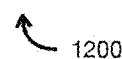

RACK POWER DISTRIBUTION UNIT METHOD AND SYSTEM FOR CONSTRUCTION ALLOWING GREATER UNIT PERMUTATIONS AND OPTIMIZED MANUFACTURING EFFICIENCY

BACKGROUND

With increasing development of information industries and networks, power distribution units provided are becoming more varied and require increasing customization in a myriad of various applications. Nowadays, it is common to have multiple parameters and data capabilities to service a wide range of requirements in information technology (IT) operations. Generally, a power distribution unit is used to distribute electric power among the computers or servers of the data center. For designing the power distribution unit, the kind of utility power provided to the power distribution shelf and the location of the power distribution unit should be considered and designed in advance. Accordingly, an exclusive power distribution unit is assembled. Therefore, the power distribution unit often may not be used with a refresh of IT equipment or in another data center with different specifications.

Due to a myriad of specification designs, local companies and others from many parts of the world build many data centers in different countries for a variety of reasons and thereby must design customized power distribution units to meet foreign specifications. As known, the utility power specifications (e.g. 120/400 volt, 3-phase, 4-wire or 220 volt, single-phase, 2-wire) for different specifications must match the design need for specific data centers. For complying with the utility power specifications, the data centers in different applications must be designed appropriately but therein comes with time constraints and typically great cost due to a lack of standardized aspects of power distribution manufacture.

Typically, a power distribution unit (PDU) is designed not only with multiple outputs designed to distribute electric power to accommodate for example, racks of computers and networking equipment located within a data center. In data centers, larger PDUs are needed to power multiple server cabinets. Each server cabinet or rows of cabinets may require multiple high current circuits possibly from different sources of incoming power or different UPSs. Standalone cabinet PDUs are self-contained units that typically include main breakers, individual circuit breakers, a series of receptacles, and power monitoring panels. Along with the challenges in power protection and management solutions is the high cost and substantial turnaround time for procuring customized PDUs. Currently, designing various desired configurations of a customized PDU to meet specification requirements is costly and takes significant time to manufacture then deliver the units to the end user. This extended turnaround time is because the current state of the art requires building the customized PDU beginning with the cover aspect of the unit. Currently the PDU industry design and construction assembly of a PDU begins with a customized cover wherein modules breakers and other aspects are assembled and mounted therein. It is costly in large part because the assembly phase requires significant challenges relating to cover design constraints that create engineering obstacles. The current method and system for providing customized rack PDUs is costly, have substantial turnaround times and have limited available configurations. Therefore, there is a need in the PDU industry to reduce the time and lower the cost to design, configure, manufacture, and deliver a less expensive PDU quicker into the hands of the user. The need is to provide lower cost, quick turnaround time and more variable configurations to the market that are unavailable with existing construction assembly methods.

For solving the above drawbacks, the manufactures usually produce many kinds of power distribution units in order to comply with different utility power specifications and IT hardware requirements. Since different power distribution units have different component specifications, the complexity of assembling the power distribution shelves and the fabricating cost are both increased. Therefore, there is a need of providing a power distribution system employing the same to obviate the drawbacks encountered from the prior arts.

FIELD OF THE INVENTION

The present invention relates generally to the field of power distribution units, and more particularly to a rack power distribution unit (PDU) that provides a method and system for construction and manufacturing rack PDUs having over 20,000 different configurations from various combinations of; receptacles, printed circuit boards, circuit breakers, PDU lengths, and monitoring through the standardization of assembly modules to efficiently produce lower cost and more reliable units not currently used in the PDU industry.

BRIEF SUMMARY OF THE INVENTION

In accordance with principles of the present invention, one embodiment of a rack PDU includes a method of constructing more than 6,000 variants using three standardized receptacles, four standardized printed circuit boards, four standardized carrier frames, two standardized monitoring frames, one standardized common frame, and one customized cover per unit. The inventive method of production involves assembling with combinations of standardized components outside of the cover and common frame. This method combined with standardizing all component parts with exception of the cover enables dramatically reduced turnaround production and delivery periods. This novel method of employing standardized components is designed to use several newly standardized receptacle modules that are mounted onto an open carrier frame whereby standardized printed circuit boards (PCBs) are attached and soldered to the lower aspects of the exposed receptacles. Further, the increase in reliability of the PDU's performance achieved by fully machine soldering the PDU's circuitry which is made possible through novel method of assembling the printed circuit boards to the receptacles outside the standardized common frame. The attached printed circuit boards are solder-connected to adjacent PCBs to reduce connection failure between the adjacent PCBs. The full soldering of wiring connections outside the common frame provides the ease and speed of machine automated assembly and substantially increases electronic reliability and lowers costs and turnaround time of production. The standardized receptacle carrier with attached and fully solder connected PCBc are mounted onto standardized common frame whereby the customized cover is mounted atop the power distribution unit. The combination of attainable variants of PDU configurations that may be assembled and constructed is more than 6,000 combinations in this embodiment. The estimated reduction in material and inventory costs may be as high as 30% and the realized estimated reduction in labor costs may be upwards of 40%.

BRIEF DESCRIPTION OF THE DRAWINGS

In the drawings:

FIG. 1B depicts a 3-Dimensional view of an embodiment of a power distribution unit in accordance with principles of the present invention;

FIGS. 3A1-3A3 are top views of standardized receptacles;

FIGS. 3B1-3B4 are top views of standardized receptacle carriers;

FIGS. 3C1-3C4 are top views of standardized printed circuit boards;

FIGS. 4A1-4A15 are top views showing one embodiment of three receptacle group variants possible from standardized elements; receptacles, receptacle frame carriers, and receptacle boards.

FIGS. 4B1-4B15 are top views showing one embodiment of six receptacle group variants possible from standardized elements; receptacles, receptacle frame carriers, and receptacle boards.

FIGS. 5A1-5A6 are top views of standardized receptacle module variants;

FIGS. 5B1-5B8 are top views of standardized receptacle module variants with printed circuit board four standardized printed circuit board variants;

DETAILED DESCRIPTION

Figure 1A:
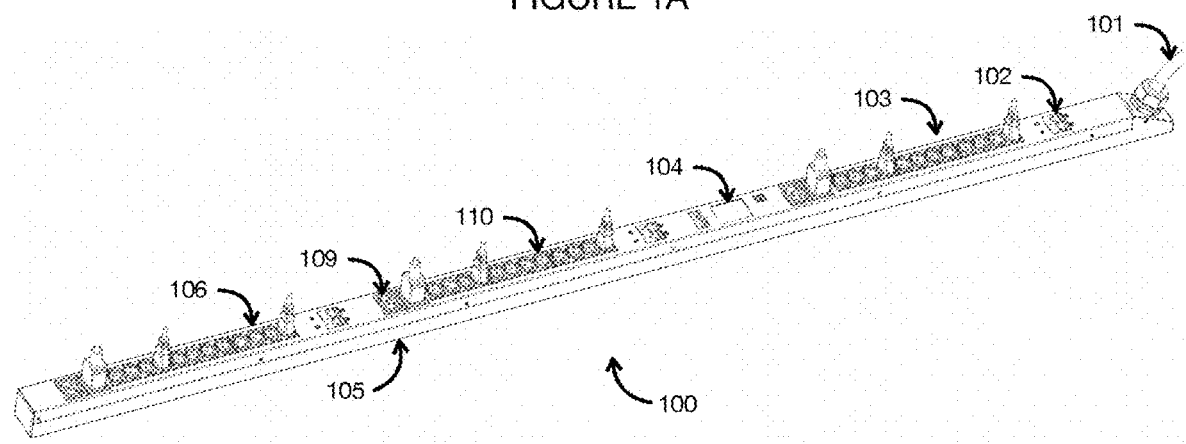
FIG. 1A depicts a 3-Dimensional view of an embodiment of a power distribution unit in accordance with principles of the present invention.

FIG. 1A shows a 3-Dimensional view of one embodiment 100 three receptacle group variant of the power distribution unit fully assembled where cover 106 encloses common chassis 105. About the top surface of chassis 105 electrical power cord 101 enters the power distribution assembly 100 at power distribution assembly end. In the one embodiment circuit breaker 102 is positioned to regulate power flow for incoming power to the immediate downstream receptacle groups 103. FIG. 1A further shows three standardized receptacle modules 103. Each of the three receptacle groups 103 in the FIG. 1A embodiment show two C19 receptacles 109 and twelve C13 receptacles 110. In this embodiment data display window 104 provides readable power distribution unit data. In this example, the power distribution unit is 30 A 208V 36-C13 6-C19 with data (1 of 6,000).

FIG. 1B shows a 3-Dimensional view of one embodiment 200 of a six receptacle group variant of the power distribution unit fully assembled where cover 107 encloses common chassis 105. About the top surface of chassis 105 power cord 101 enters the power distribution assembly 200 through opening (not shown) at power distribution assembly end. In this one embodiment circuit breaker 102 are positioned to regulate power flow into the power distribution unit assembly 200. FIG. 1B further shows six standardized receptacle groups 103, each of the six receptacle groups contain 4 C13 receptacles and three C19 receptacles totaling twenty-four C13 receptacles and eighteen C19 receptacles of the 30 A 240V variant. In this example, the power distribution unit is 30 A 240V 24-C13 18-C19 with no data (1 of 6,000).

Figure 1C:
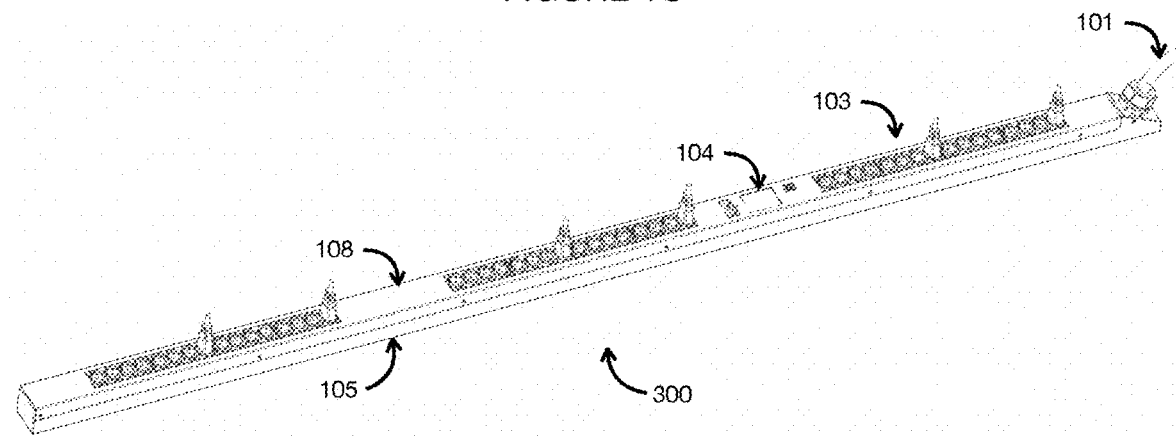
FIG. 1C depicts a 3-Dimensional view of an embodiment of a power distribution unit in accordance with principles of the present invention.

FIG. 1C shows a 3-Dimensional view of one embodiment 300 of a six receptacle module variant of the power distribution unit fully assembled where cover 108 encloses common chassis 105. About the top surface of chassis 105 power cord 101 enters the power distribution assembly 300 through opening (not shown) at power distribution assembly end. In this one embodiment the power distribution unit assembly contains three receptacle groups 103 variant of the power distribution unit fully assembled where cover 108 encloses common chassis 105. This variant contains three receptacle groups wherein each group contains 16 C13 receptacles and provides a total of 48 C13 receptacles of the 20 A 208V variant. In this embodiment data display window 104 provides readable power distribution unit data. In this example, the power distribution unit is 20 A 208V 48-C13 with data (1 of 6,000).

FIG. 1D below is a table 350 demonstrating the number of variants available with utilization of the novel construction method to obtain various power types using; using standardized receptacles, standardized printed circuit boards, standardized carrier frames, standardized common chassis of selectable lengths, and customized covers in optional color choices and a cord locking option. The variants allowing 11 different power configurations, six PDU length options, three data type options. twenty-six receptacle combination options, three 5-15 tech power options, four color options, and two IT cord locking options. The variants may be designed to include specific combinations of C13 and C19 receptacles, although the number of C13, C19 and 5-15R variations is much greater. The Table demonstrates the large quantity of variations of rack PDUs.

| POWER TYPES | LENGTHS | C13 VARIATION | C19 VARIATION | 5-15R VARIATION | MONITORING TYPES |
|---|---|---|---|---|---|
| 20 A 208 V | 24 | 6 | 4 | 0 | BASIC - NONE |
| 30 A 208 V | 36 | 12 | 6 | 1 | MONITORED |
| 20 A 120/208 V 3 PH | 41 | 24 | 12 | 2 | SWITCHED |
| 30 A 120/208 V 3 PH | 72 | 30 | 18 | | |
| 30 A 240 V 3 PH | 82 | 32 | 24 | | |
| 35 A 240 V 3 PH | 92 | 36 | 30 | | |
| 50 A 240 V 3 PH | | 48 | 36 | | |
| 60 A 240 V 3 PH | | | | | |
| 20 A 415 V 3 PH | | | | | |
| 30 A 415 V 3 PH | | | | | |
| 60 A 415 V 3 PH | | | | | |

Figure 2A:
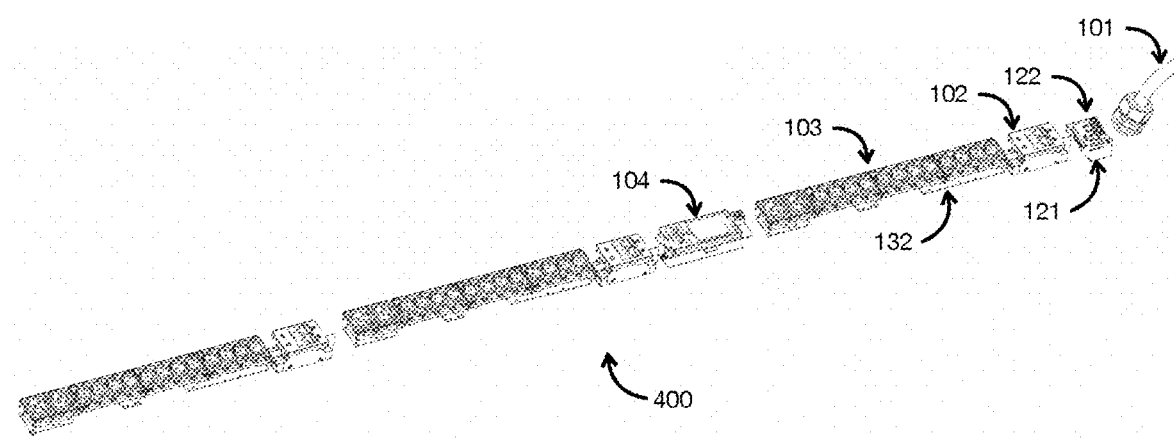
FIG. 2A is a 3-Dimensional view of one embodiment of a power distribution unit in accordance with principles of the present invention at a stage of construction prior to chassis insertion.

FIG. 2A is a 3-Dimensional view of one embodiment 400 where three standardized receptacle modules 103 are set onto standardized common chassis 400 aligned as per specification. In this variant each of the standardized receptacle groups 103 are composed of two C19 receptacles and 12 C13 receptacles. Below each receptacle group is a circuit board 132 that provides power to the individual receptacles located along receptacle group 103. Preceding each of the three standardized receptacle groups 103 are three circuit breakers 102. In the variant illustrate, one end of the PDU is electrical power cord 101 that enters the power distribution assembly. Power cord 101 connects to entrance module 122. Entrance module 122 is comprised of circuit board (not shown) and carrier 121. Included in the embodiment is data display 104. Data display 104 is an optional feature that displays power usage of each of the three groups. In this example, the standardized elements are assembled in the fixture for the soldering process.

Figure 2B:
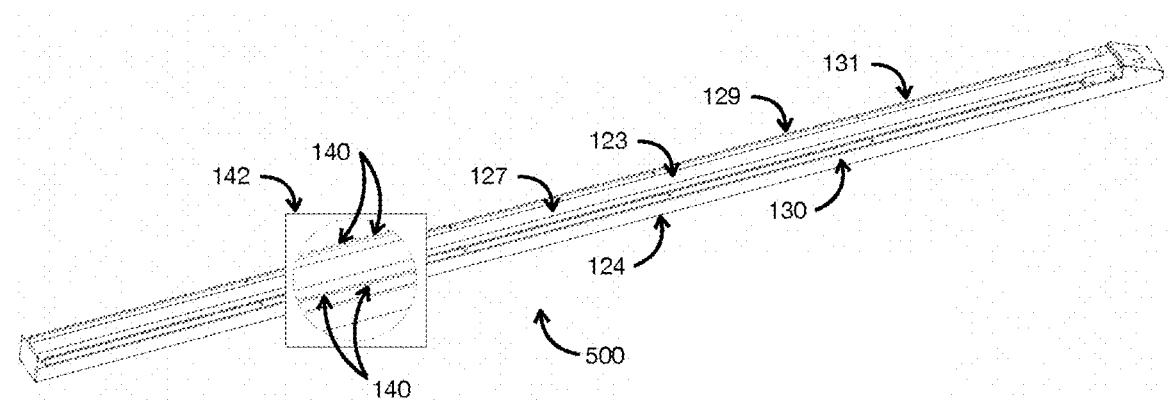
FIG. 2B is a 3-Dimensional view of one embodiment where standardized common chassis is designed to receive a fitted attachable standardized receptacle carrier.

FIG. 2B is a 3-Dimensional view of one embodiment where standardized common chassis 500 is designed to receive standardized receptacle groups not shown, circuit breaker groups not shown, entrance module not shown and standardized data modules not shown to fit the standardized common chassis 500. The standardized common chassis is an elongated structure with an interior surface 123, and exterior surface 124, end 125, and opposing end 126. Opposing end 126 provides and aperture 127 where power cord (not shown) passes through. Aperture 127 location may be designed on the upper surface of opposing end 127 or lower surface (not shown) of opposing end 126. Along the upper edge 129 of opposing sides of elongated side 130, are protruding indexing aspects 131 that interface with the standardized carriers). On each side of aperture, there are aligned features 140 as shown in magnified view 142 of a portion of the top of the chassis. The features 140 are spaced apart between the two ends of the chassis. Receptacle modules can each define a structure configured to engage any of the features for selective placement of the respective module at a different position between the ends of the chassis. In this way, the module types and placement can be customizable at the stage of manufacture. Also, in this example, a singular chassis (1 of 1) of a PDU is shown having a 72" length.

Figure 2C:
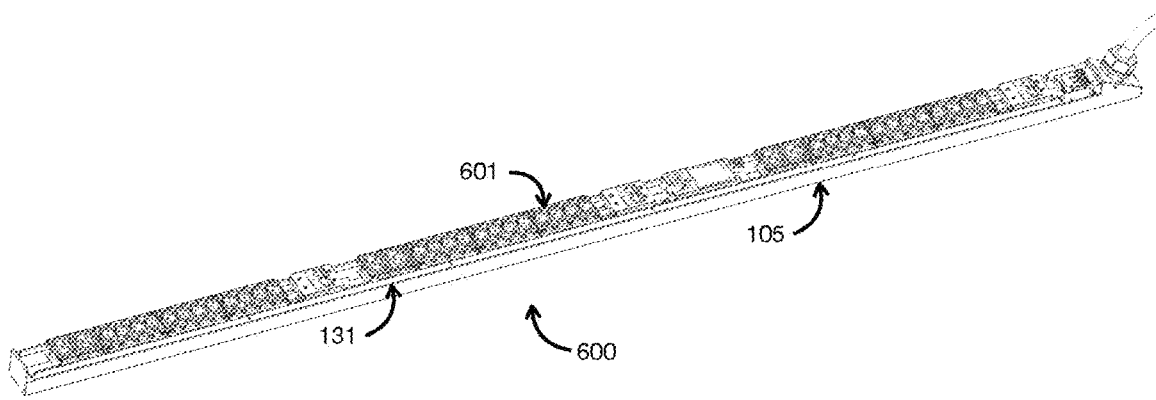
FIG. 2C is a 3-Dimensional view of one embodiment of a power distribution unit in accordance with principles of the present invention at a stage of construction prior to cover attachment.

FIG. 2C is a 3-Dimensional view of one embodiment where an assembled PDU 600 is shown prior to customized cover (not shown) attachment. Assembled PDU 600 contains a fully assembled power spine 601 placed in the standardized common chassis 105. The assembled power spine 601 is placed into the common chassis 105 where it engages with the protruding indexing aspects 131 such that all elements are positioned for customized cover (not shown) alignment. In this example, the spine is placed in the chassis (1 of 6,000).

Figure 2D:
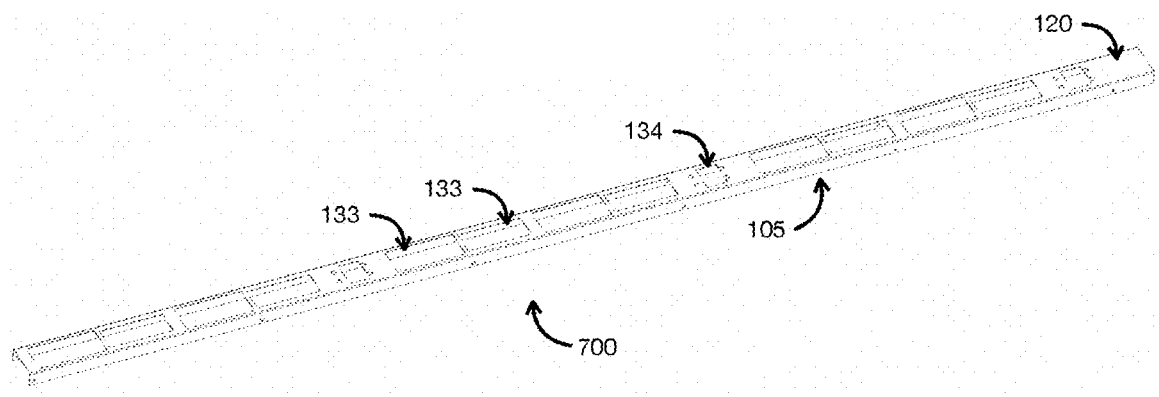
Figure 2D is a 3-Dimensional view of one embodiment wherein customized cover is designed to include a plurality of openings.

FIG. 2D is a 3-Dimensional view of one embodiment wherein customized cover 700 is designed to include a plurality of apertures 133 designed to receive a plurality of receptacle groups (not shown), an optional data module (not shown), and apertures 134 to receive circuit breaker modules (not shown). Aside from three types of internal wires that are fabricated in house, using automation, to lengths based on computer aided design tables for that variant, the Cover 700 provides the only uniquely customized component of the production method. The only aspect of the cover 700 that is customized is the top surface 120. Cover 700 is automatically generated from 3 D computer aided design tables and is fabricated at the same time the power distribution variant is being manufactured. Concurrent with the production of the specified power distribution unit variant, cover 700 is fabricated, painted, and labeled. The standardized components (not shown) are assembled into a power spine (not shown) according to computer aided design tables for the particular variant. The power spine assembly (not shown) is then inserted into the standardized chassis at the computer assigned indexing for the particular variant. In this example, the cover is provided that is specific to the examples provided herein. It is introduced at a final or near final step of assembly.

FIGS. 3A1-3A3 are top views of the three standardized C13 receptacles 800 which includes, a C13×4 receptacle 801, a C13×2 receptacle 802, and a C19×1 receptacle 803, respectively. Variant combinations of the standardized receptacles 801, 802, and 803 can be arranged in a range of different combinations to comply with required specifications. The following table identifies the type of receptacle for each receptacle 801, 802, and 803.

| RECEPTACLE | TYPE |
|---|---|
| 801 | 4-C13 |
| 802 | 2-C13 |
| 803 | 1-C19 |

FIGS. 3B1-3B4 are top views of standardized receptacle module carriers 900, which have been subdivided into four standardized carrier species; standardized carrier 901 has been designed to receive four C13 receptacles, standardized carrier 902 has a capacity to accommodate two C13 receptacles, standardized carrier 903 has a capacity of up to four C19 receptacles. Standardized carrier 904 has a capacity to accommodate up to two C19 receptacles. The following table identifies the type of receptacle for each receptacle 901, 902, 903, and 904 and primary and secondary information for each.

| FRAME | PRIMARY | ALTERNATE |
|---|---|---|
| 901 | 4-C13 | NONE |
| 902 | 2-C13 | NONE |
| 903 | 4-C19 | 3-C19 |
| 904 | 2-C19 | 1-C19 |

FIGS. 3C1-3C4 are top views of standardized printed circuit boards 1000. Standardized printed circuit boards 1000 is further subdivided into four standardized printed circuit boards; 1001, 1002, 1003, and 1004, respectively. Printed circuit board 1001 is designed with a primary capacity to receive eight C13 receptacles and a secondary capacity to receive six C13 receptacles (not shown). Printed circuit board 1002 is designed with a primary capacity to receive four C13 receptacles and a secondary capacity to receive two C13 receptacles (not shown). Printed circuit board 1003 is designed with a primary capacity to receive four C19 receptacles (not shown) and a secondary capacity to receive three C13 receptacles (not shown). Printed circuit board 1004 is designed with a primary capacity to receive two C19 receptacles (not shown) and a secondary capacity to receive one C13 receptacle (not shown). Each printed circuit board is designed with standard input to board wiring point(s) and board to board wiring termination point(s) 1005. The following table identifies the type of receptacle for each receptacle 1001, 1002, 1003, and 1004 and primary and secondary information for each.

| BOARD | PRIMARY | SECONDARY |
|---|---|---|
| 1001 | 8-C13 | 6-C13 |
| 1002 | 4-C13 | 2-C13 |
| 1003 | 4-C19 | 3-C19 |
| 1004 | 2-C19 | 1-C19 |

FIGS. 4A1-4A15 are top views showing fifteen 3-receptacle group variants 1101-1115 possible from standardized module elements. Additional variants are possible. Standardized assembly elements include; C13 receptacles 108, C19 receptacles 109, receptacle frame carriers (not shown), and printed circuit boards 110. 3-receptacle groups variants are used in some power types as defined by UL and other agencies. In this example, there are 3-receptacle group variants.

FIGS. 4B1-4B15 are top views showing fifteen 6-receptacle group variants 1116-1130 possible from standardized module elements. Additional variants are possible. Standardized assembly elements include; C13 receptacles 108, C19 receptacles 109, receptacle frame carriers (not shown), and printed circuit boards 110. 6-receptacle groups variants are used in some power types as defined by UL and other agencies. In this example, there are 6-receptacle group variants.

FIGS. 5A1-5A6 are top views of various combinations of receptacle modules 1101-1106. Collectively modules 1100 are for illustration and do not encompass all possible variations. Receptacle module 1101 securing four C13 receptacles with carrier 1107 and module 1102 securing two C13 receptacles with carrier 1108, respectively. Module 1103 securing four C19 receptacles with carrier 1110 and module 1104 securing three C19 receptacles with carrier 1110. Standardized module 1105 holds two C19 receptacles with carrier 1111. Standardized module 1106 holds one C19 receptacle with carrier 1111. In this example, there are variable receptacle-frame groups.

FIGS. 5B1-5B8 are top views of standardized receptacles with standardized printed circuit boards, collectively 1200. Two C13 receptacles 1201 are shown connecter to printed circuit board 1209. Four C13 receptacles 1202 are shown connected to printed circuit board 1209. Six C13 receptacles 1203 are shown connected to printed circuit board 1210. Eight C13 receptacles are shown connected to printed circuit board 1210. One C19 receptacle 1205 is shown connected to printed circuit board 1211. Two C19 receptacles 1206 are shown connected to printed circuit board 1211. Three C19 receptacles 1207 are shown to be connected to printed circuit board 1212. And, four C19 receptacles 1208 are shown to be connected to printed circuit board 1212. In this example, there are modules combining standardized receptacle-frame groups with receptacle boards (frames not shown so boards are visible).

Figure 5C:
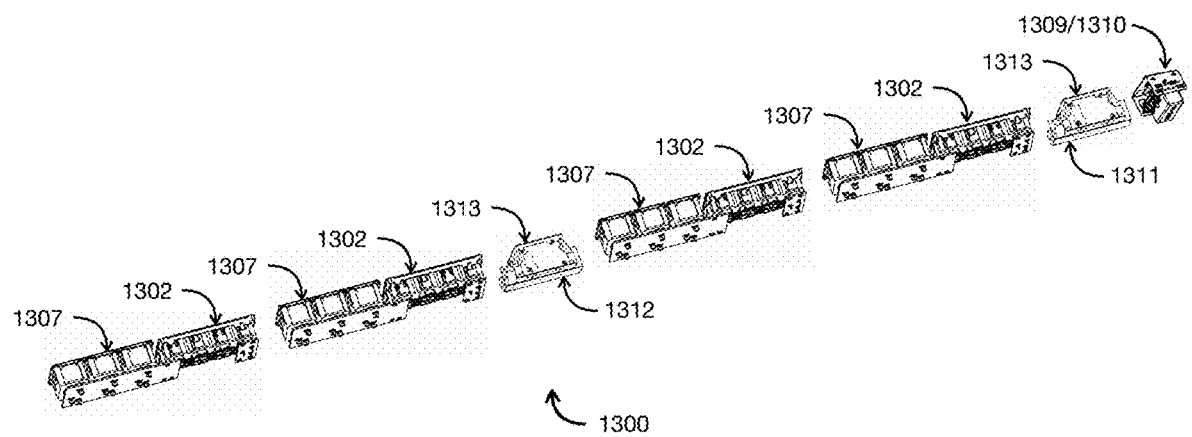
FIG. 5C is a 3-dimensional view of a stage of construction where standardized receptacle module variants are in proximity to each other and joined with standardized breakers and the standardized entrance module to form a power spine.

FIG. 5C, is a three dimensional view of the power spine stage of assembly is depicted. The power spine 1300 is comprised of the entrance module assembly 1309/1310, all receptacle module assemblies 1302/1307, and all circuit breakers 1311/1312, and a carrier 1313 for electrical breakers. As illustrated in previous figures the elements in FIG. 5C illustrate a bottom view of the power spine 1300 that interfaces with inner surface on the bottom of the standardized chassis (not shown). The value of assembling the power spine outside the chassis or as currently in the manufacturing of PDU art is the ability to machine solder which cannot be done while the power spine has been assembled into cover or chassis.

| MODULES | PRIMARY USE |
|---|---|
| 1201 | RECEPTACLE 2-C13 |
| 1202 | RECEPTACLE 4-C13 |
| 1203 | RECEPTACLE 6-C13 |
| 1204 | RECEPTACLE 8-C13 |
| 1205 | RECEPTACLE 1-C19 |
| 1206 | RECEPTACLE 2-C19 |
| 1207 | RECEPTACLE 3-C19 |
| 1208 | RECEPTACLE 4-C19 |
| 1209 | ENTRANCE TYPE A |
| 1210 | ENTRANCE TYPE B |
| 1211 | BREAKER TYPE A |
| 1212 | BREAKER TYPE B |
| 1213 | TECH POWER TYPE A |
| 1214 | TECH POWER TYPE B |
| 1215 | DATA TYPE A |
| 1216 | DATA TYPE B |
| 1217 | DATA TYPE C |

Figure 6A:
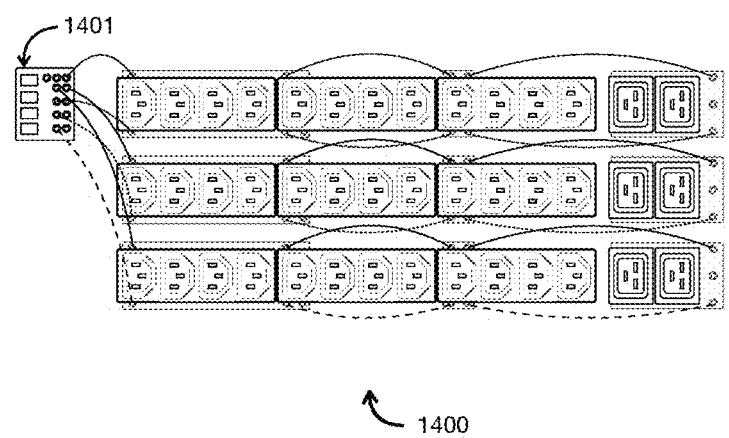
FIG. 6A is a top view of a power spine with three groups side by side ready for automated machine soldering.

FIG. 6A shows a top view of a single power spine 1400. The illustration of FIG. 6A shows entrance module 1401. The illustration demonstrates the capability and method of machine soldering of palletized power spines. The advantage of soldering outside the chassis or cover is both in turnaround time as well as cost. In this example, receptacle groups and entrance module spine are shown. This allows automated soldering while in the fixture.

Figure 6B:
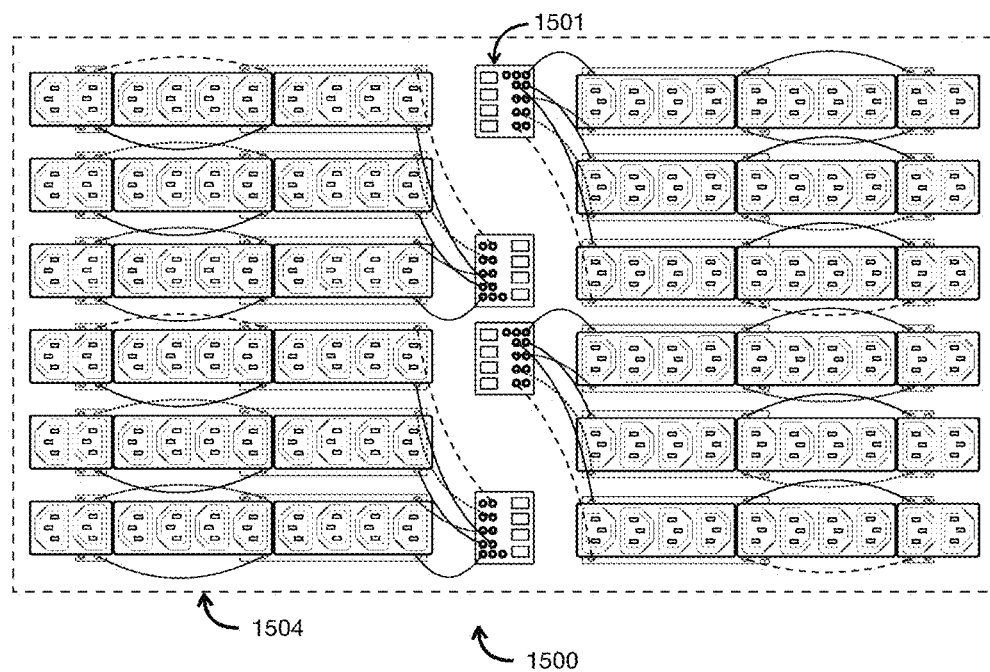
FIG. 6B is a top view of four power spines brought together for manufacturing efficiency, each with three groups side by side ready for automated machine soldering.

FIG. 6B shows a top view of four power spines 1500. The illustration of FIG. 6B shows four entrance modules 1501, 1502, 1503 and 1504 respectively. The illustration demonstrates the capability and method of machine soldering of palletized power spines. The advantage of soldering outside the chassis or cover is both in turnaround time as well as cost. In this example, the entrance wire length allows the receptacle group to stretch out to final positions.

Figure 7A:
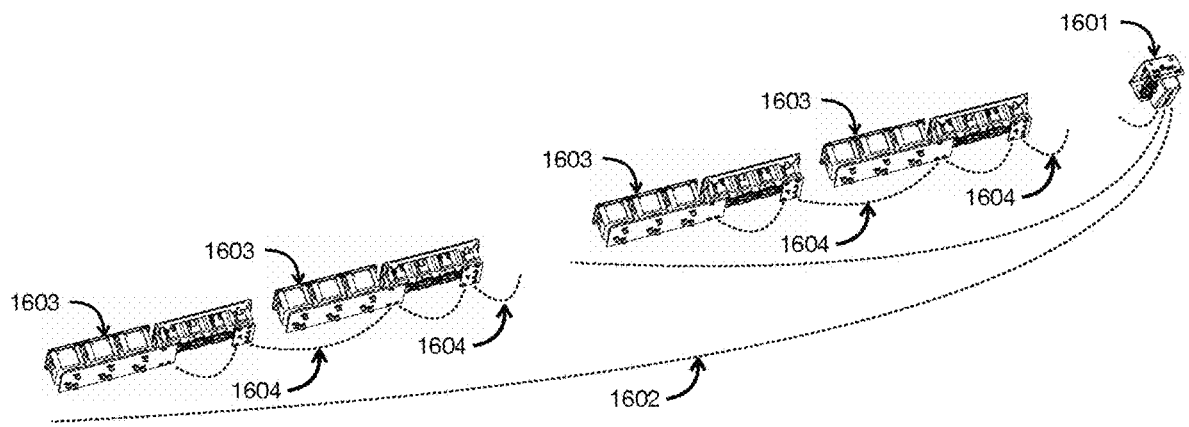
FIG. 7A is a 3-dimensional view of a power spine for variants not requiring circuit breakers.

FIG. 7A shows a bottom view of the power spine 1600 of one embodiment. This illustration shows the soldering points of receptacle modules 1604, printed circuit boards 1603 and entrance module 1601. The process of automated selective or wave soldering is made possible by the process of power spine assembly and soldering before the power spine is place in the chassis or PDU cover. Wires 1602 are shown. In this example, the receptacle groups and entrance module spine allows automated soldering while in the fixture.

Figure 7B:
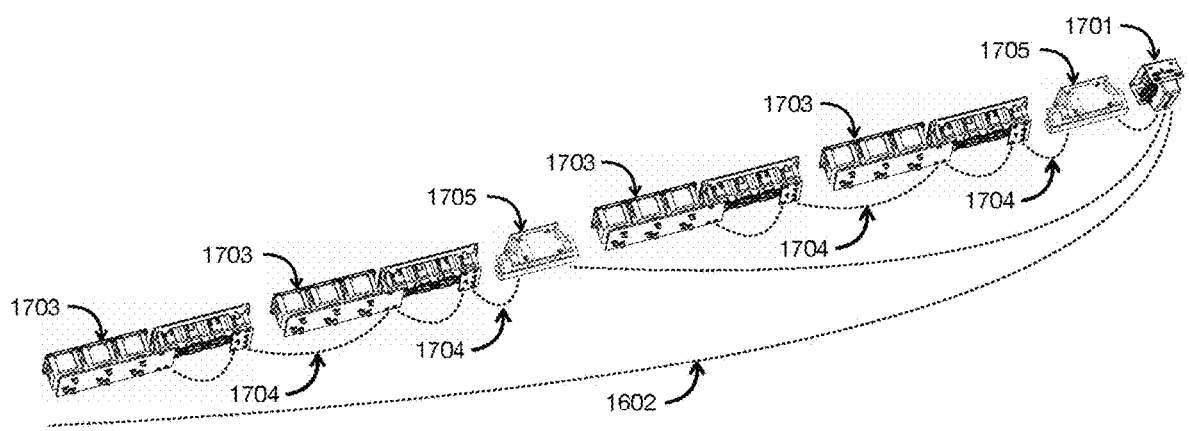
FIG. 7B is a 3-dimensional view of a power spine for variants requiring circuit breakers.

FIG. 7B shows a bottom view of the power spine 1700 of one embodiment. This illustration shows the soldering points of receptacle modules 1704, printed circuit boards 1703, circuit breaker 1705, display (not shown), and entrance module 1701. The process of automated selective or wave soldering is made possible by the process of power spine assembly and soldering before the power spine is place in the chassis or PDU cover. Wires 1602 are shown. In this example, the breakers and the display (not shown) is shown as being introduced to the spine prior to insertion of the spine into the chassis.

What is claimed:

1. A power distribution unit comprising:
   a chassis having a first end and a second end, wherein the chassis defines a surface that extends between the first end and the second end, wherein the surface defines a plurality of features that are spaced apart between the first end and the second end;
   a plurality of modules that each define a structure configured to engage any of the features for selective placement of the respective module at a different position between the first end and the second end of the chassis;
   wherein the modules are wired together,
   wherein the modules are arrangeable in one of a first configuration and a second configuration,
   wherein, in the first configuration, the modules are arranged with modules of other power distribution units for machine soldering together; and
   wherein, in the second configuration, the modules are positioned for engagement with the chassis.

2. The power distribution unit of claim 1, wherein the plurality of modules are receptacle modules.

3. The power distribution unit of claim 2, wherein the receptacle modules are substantially aligned within the chassis.

4. The power distribution unit of claim 1, further comprising wiring for operatively connecting the plurality of modules outside the chassis.

5. The power distribution unit of claim 4, wherein the wiring is operatively soldered to the modules outside the chassis.

6. The power distribution unit of claim 1, further comprising a cover for enclosing the chassis.

7. The power distribution unit of claim 6, wherein the cover defines a plurality of apertures that each align with a position of a respective one of the modules.

8. The power distribution unit of claim 1, further comprising a circuit breaker for regulating power flow to the modules.

9. The power distribution unit of claim 1, further comprising a printed circuit board that is housed within the chassis.

10. The power distribution unit of claim 9, wherein the printed circuit board is operatively connected to one or more of the modules.

11. The power distribution unit of claim 1, wherein the plurality of modules comprises an entrance module operatively connected to the other modules.

12. The power distribution unit of claim 11, wherein the entrance module is soldered to the other modules.

13. The power distribution unit of claim 1, further comprising a plurality of carriers configured to hold the plurality of modules.

14. The power distribution unit of claim 1, wherein each of the modules comprises a carrier and a receptacle, and wherein each module is operatively soldered.

15. The power distribution unit of claim 1, wherein at least one of the modules comprises a carrier and electrical breaker.

16. A method of assembling a power distribution unit, the method comprising:
    providing a chassis having a first end and a second end, wherein the chassis defines a surface that extends between the first end and the second end, wherein the surface defines a plurality of features that are spaced apart between the first end and the second end;
    positioning a plurality of modules for engagement with the chassis, wherein each module defines a structure configured to engage any of the features for selective placement of the respective module at a different position between the first end and the second end of the chassis;
    operatively wiring the modules together;
    arranging the modules in a first configuration with modules of other power distribution units for machine soldering together; and
    arranging the modules in a second configuration for the positioning for engagement with the chassis.

17. The method of claim 16, wherein the plurality of modules are receptacle modules.

18. The method of claim 17, wherein the receptacle modules are substantially aligned within the chassis.

19. The method of claim 16, further comprising wiring for operatively connecting the plurality of modules.

20. The method of claim 19, wherein the wiring is operatively soldered to the modules.

21. The method of claim 16, further comprising a cover for enclosing the chassis.

22. The method of claim 21 wherein the cover defines a plurality of apertures that each align with a position of a respective one of the modules.

23. The method of claim 16, further comprising a circuit breaker for regulating power flow to the modules.

24. The method of claim 16, further comprising a printed circuit board that is housed within the chassis.

25. The method of claim 24, wherein the printed circuit board is operatively connected to one or more of the modules.

26. The method of claim 16 wherein in the first configuration at least some of the modules of the power distribution units are arranged side-by-side.

* * * * *